(12) United States Patent  (10) Patent No.: US 7,649,166 B2
Liu et al.  (45) Date of Patent: Jan. 19, 2010

(54) NEAR-FIELD NANO-IMAGER

(75) Inventors: Boyang Liu, Evanston, IL (US);
Seng-Tiong Ho, Wheeling, IL (US)

(73) Assignee: Northwestern University, Evanston, IL (US)

( * ) Notice: Subject to any disclaimer, the term of this patent is extended or adjusted under 35 U.S.C. 154(b) by 0 days.

(21) Appl. No.: 12/233,273

(22) Filed: Sep. 18, 2008

(65) Prior Publication Data

US 2009/0095882 A1 Apr. 16, 2009

Related U.S. Application Data

(60) Provisional application No. 60/973,182, filed on Sep. 18, 2007.

(51) Int. Cl.
*H01L 27/00* (2006.01)
(52) U.S. Cl. ............... 250/208.1; 250/214.1; 250/306; 73/105; 977/810
(58) Field of Classification Search ............ 250/208.1, 250/214.1, 306, 307; 73/105; 977/810, 811, 977/813, 862
See application file for complete search history.

(56) References Cited

U.S. PATENT DOCUMENTS

2009/0174022 A1* 7/2009 Coe-Sullivan et al. ....... 257/448

* cited by examiner

*Primary Examiner*—Kevin Pyo
(74) *Attorney, Agent, or Firm*—Morris, Manning & Martin LLP; Tim Tingkang Xia

(57) ABSTRACT

An imaging device. In one embodiment, the imaging device includes a plurality of first electrode strips in parallel to each other along a first direction x, wherein each first electrode strip has an elongated body with a first surface and an opposite, second surface and a thickness $n_1$. The imaging device also includes a plurality of second electrode strips in parallel to each other along a second direction y that is substantially perpendicular to the first direction x, wherein each second electrode strip has an elongated body with a first surface and an opposite, second surface and a thickness $n_2$. The plurality of second electrode strips are positioned apart from the plurality of first electrode strips along a third direction z that is substantially perpendicular to the first direction x and the second direction y such that the plurality of first electrode strips and the plurality of second electrode strips are crossing each other accordingly to form a corresponding number of crossing points. And at each crossing point, a semiconductor component is filled between the second surface of a corresponding first electrode strip and the first surface of a corresponding second electrode strip to form an addressable pixel.

18 Claims, 11 Drawing Sheets

(a)

(b)

NEAR-FIELD NANO-IMAGER

CROSS-REFERENCE TO RELATED PATENT APPLICATION

This application claims the benefit, pursuant to 35 U.S.C. §119(e), of U.S. provisional patent application Ser. No. 60/973,182, filed Sep. 18, 2007, entitled "Near-Field Nano-Imager Based on Nanophotodetector Array" by Boyang Liu and Seng-Tiong Ho, which is incorporated herein by reference in its entirety.

STATEMENT OF FEDERALLY-SPONSORED RESEARCH

This invention was made with government support under Grant Nos. NCC 2-1363 and ECCS 0622185 awarded by National Aeronautics and Space Administration (NASA) and National Science Foundation (NSF), respectively. Accordingly, the United States Government has certain rights in the invention.

Some references, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference was individually incorporated by reference. In terms of notation, hereinafter, superscript "n" represents the nth reference cited in the reference list. For example, superscript "7" represents the 7th reference cited in the reference list, namely, Boyang Liu and Seng-Tiong Ho, "Sub-100 nm Nanolithography and Pattern Transfer on Compound Semiconductor using Sol-gel Derived TiO2 Resist", Journal of The Electrochemical Society, Vol. 155, No. 5, 2008.

FIELD OF THE INVENTION

The present invention relates generally to a nanoscale imaging device, and more particularly to a nanoscale imaging device having a nanoscale-pixel photodetector array.

BACKGROUND OF THE INVENTION

To explore the microscopic world, people have been using conventional optical microscopy for a long time. However, due to the diffraction limit the highest resolution of conventional optical microscope is only about $\lambda/2$, where $\lambda$ is the wavelength of illuminating light. As a result, the conventional optical microscope could not be used to see objects smaller than ~200 nm when using visible light. To break the diffraction limit, one current approach is based on Near-field Scanning Optical Microscope (NSOM) [1], which has found wide applications in nano-technologies, materials science, biology and other areas. The advantages of NSOM imaging include: sub-wavelength resolution (50-200 nm) using visible or near-IR light, simultaneous acquisition of optical and topographical information, capable of imaging aqueous samples. In addition, since NSOM imaging system is able to use various light sources to illuminate specimen surface, it may provide more functions, such as excitation and fluorescence of material under study.

However, one main limitation of NSOM is the very low light power throughput of its near-field scanning tip, typically $10^{-3}$ to $10^{-6}$ throughput for 200 nm to 50 nm wide tip apertures [2] at $\lambda=500$ nm. Another limitation of NSOM is that it requires the mechanical scanning of the near-field tip to image an object, which will inevitably lead to a slow-speed and still-object only imaging.

Therefore, a heretofore unaddressed need exists in the art to address the aforementioned deficiencies and inadequacies.

SUMMARY OF THE INVENTION

The present invention, in one aspect, relates to an imaging device. In one embodiment, the imaging device includes a plurality of first electrode strips in parallel to each other along a first direction x, wherein each first electrode strip has an elongated body with a first surface and an opposite, second surface and a thickness $n_1$. The imaging device also includes a plurality of second electrode strips in parallel to each other along a second direction y that is substantially perpendicular to the first direction x, wherein each second electrode strip has an elongated body with a first surface and an opposite, second surface and a thickness $n_2$. The plurality of second electrode strips are positioned apart from the plurality of first electrode strips along a third direction z that is substantially perpendicular to the first direction x and the second direction y such that the plurality of first electrode strips and the plurality of second electrode strips are crossing each other accordingly to form a corresponding number of crossing points. And at each crossing point, a semiconductor component is filled between the second surface of a corresponding first electrode strip and the first surface of a corresponding second electrode strip to form an addressable pixel, wherein the semiconductor component has a thickness $n_s$ that satisfies the following relationship: $n_s \geq n_1, n_2$.

In operation, when an illuminating light containing information of an object is incident onto the first surface of a first electrode strip of an addressable pixel, a corresponding imaging signal is generated at the second surface of the corresponding second electrode strip.

In one embodiment, the semiconductor component comprises a layered structure containing at least at least one layer of a first semiconductor and at least one layer of a second semiconductor. In one embodiment, the layered structure is a graded super lattice comprising a layer of InGaAs, as the at least one layer of a first semiconductor, between two layers of InAlAs, as at least one layer of a second semiconductor. Moreover, a grading layer of InAlAs/InGaAs is filled between each of the two layers of InAlAs and a corresponding surface of the layer of InGaAs, and the graded super lattice has a thickness <1,000 nm.

Each first electrode strip is a transparent conducting oxide electrode. In one embodiment, the transparent conducting oxide electrode comprises Au/Ti, and has a thickness of about 60 nm.

Each second electrode strip is a transparent conducting oxide electrode or a metal electrode.

The imaging device further has a plurality of detector circuits, wherein each detector circuit is connectable to a first electrode strip and a second electrode strip of a corresponding pixel for detecting imaging signals generated at that pixel.

Furthermore, in one embodiment, a protective material such as benzocyclobutene (BCB) is filled between pixels to support device structures and form cladding layer to each pixel.

The present invention, in another aspect, relates to an imaging device. In one embodiment, the imaging device includes a plurality of first electrode strips in parallel to each other along a first direction x, wherein each first electrode strip has an elongated body with a first surface and an opposite, second surface and a thickness $n_1$. The imaging device also includes a plurality of second electrode strips in parallel to each other along a second direction y that is substantially perpendicular to the first direction x, wherein each second electrode strip has an elongated body with a first surface and an opposite, second surface and a thickness $n_2$. The plurality of second electrode strips are positioned apart from the plurality of first electrode strips along a third direction z that is substantially perpendicular to the first direction x and the second direction y such that the plurality of first electrode strips and the plurality of second electrode strips are crossing each other accordingly to form a corresponding number of crossing points. A semiconductor component is filled between the plurality of first electrode strips and the plurality of second electrode strips to form an addressable pixel at each crossing point, wherein the semiconductor component has a thickness $n_s$ that satisfies the following relationship: $n_s \geq n_1, n_2$. In operation, when an illuminating light containing information of an object is incident onto the first surface of a first electrode strip of an addressable pixel, a corresponding imaging signal is generated at the second surface of the corresponding second electrode strip.

The semiconductor component comprises a layered structure containing at least at least one layer of a first semiconductor and at least one layer of a second semiconductor. In one embodiment, the layered structure is a graded super lattice having a layer of InGaAs, as the at least one layer of a first semiconductor, between two layers of InAlAs, as at least one layer of a second semiconductor.

In one embodiment, a grading layer of InAlAs/InGaAs is filled between each of the two layers of InAlAs and a corresponding surface of the layer of InGaAs, and the graded super lattice has a thickness <1,000 nm.

Each first electrode strip is a transparent conducting oxide electrode. In one embodiment, the transparent conducting oxide electrode comprises Au/Ti, and has a thickness of about 60 nm.

Each second electrode strip is a transparent conducting oxide electrode or a metal electrode.

The imaging device further has a plurality of detector circuits, wherein each detector circuit is connectable to a first electrode strip and a second electrode strip of a corresponding pixel for detecting imaging signals generated at that pixel.

Furthermore, in one embodiment, a protective material such as benzocyclobutene (BCB) is filled between pixels to support device structures and form cladding layer to each pixel.

The present invention, in yet another aspect, relates to an imaging device. In one embodiment, the imaging device includes at least one imaging pixel, wherein the at least one imaging pixel has a first electrode strip having a first surface and an opposite, second surface and a thickness $n_1$, a second electrode strip having a first surface and an opposite, second surface and a thickness $n_2$, and wherein the second electrode strip is positioned apart from the first electrode strip, and a semiconductor component is filled between the first electrode strip and the plurality of second electrode strip, wherein the semiconductor component has a thickness $n_s$ that satisfies the following relationship: $n_s \geq n_1, n_2$, and wherein, in operation, when an illuminating light containing information of an object is incident onto the first surface of the first electrode strip, a corresponding imaging signal is generated at the second surface of the second electrode strip.

The semiconductor component has a layered structure containing at least at least one layer of a first semiconductor and at least one layer of a second semiconductor, wherein the layered structure is a graded super lattice comprising a layer of InGaAs, as the at least one layer of a first semiconductor, between two layers of InAlAs, as at least one layer of a second semiconductor. In one embodiment, a grading layer of InAlAs/InGaAs is filled between each of the two layers of InAlAs and a corresponding surface of the layer of InGaAs, and wherein the graded super lattice has a thickness <1,000 nm.

The first electrode strip is a transparent conducting oxide electrode. The second electrode strip is a transparent conducting oxide electrode or a metal electrode.

The imaging device further has at least one detector circuit that is connectable to the first electrode strip and the second electrode strip for detecting imaging signals generated at that pixel.

These and other aspects of the present invention will become apparent from the following description of the preferred embodiment taken in conjunction with the following drawings, although variations and modifications therein may be affected without departing from the spirit and scope of the novel concepts of the disclosure.

DETAILED DESCRIPTION OF THE INVENTION

Figure 1:
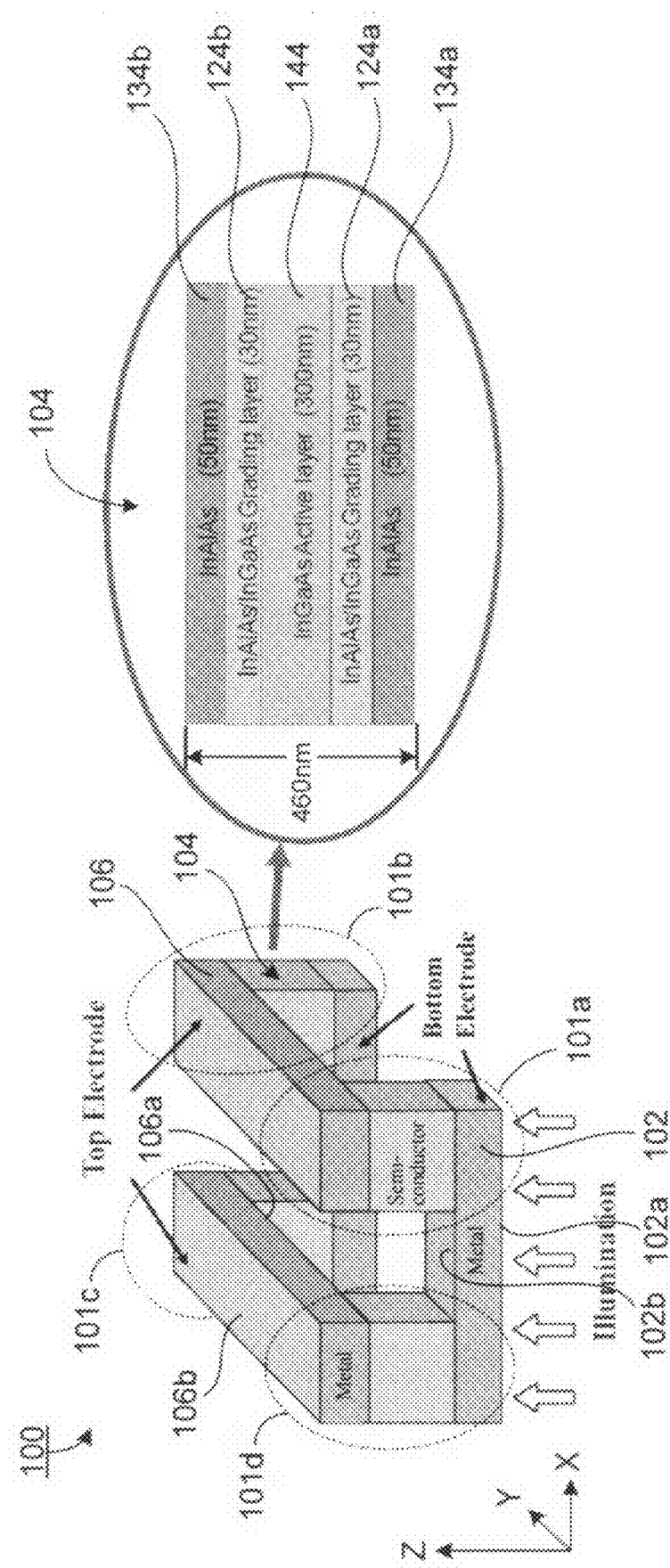
FIG. 1 is a schematic, perspective view of a nanoscale-pixel photodetector (NPD) array in part according to one embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like parts throughout the views. As used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which has no influence on the scope of the invention. Additionally, some terms used in this specification are more specifically defined below.

DEFINITIONS

The terms used in this specification generally have their ordinary meanings in the art, within the context of the invention, and in the specific context where each term is used.

Certain terms that are used to describe the invention are discussed below, or elsewhere in the specification, to provide additional guidance to the practitioner in describing the apparatus and methods of the invention and how to make and use them. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that the same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification, including examples of any terms discussed herein, is illustrative only, and in no way limits the scope and meaning of the invention or of any exemplified term. Likewise, the invention is not limited to various embodiments given in this specification. Furthermore, subtitles may be used to help a reader of the specification to read through the specification, which the usage of subtitles, however, has no influence on the scope of the invention.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the term "scanning electron microscope (SEM)" refers to a type of electron microscope that images the sample surface by scanning it with a high-energy beam of electrons in a raster scan pattern. The electrons interact with the atoms that make up the sample producing signals that contain information about the sample's surface topography, composition and other properties such as electrical conductivity.

As used herein, "nanoscopic-scale," "nanoscopic," "nanometer-scale," "nanoscale," the "nano-" prefix, and the like generally refers to elements or articles having widths or diameters of less than about 1 µm, preferably less than about 100 nm in some cases. In all embodiments, specified widths can be smallest width (i.e. a width as specified where, at that location, the article can have a larger width in a different dimension), or largest width (i.e. where, at that location, the article's width is no wider than as specified, but can have a length that is greater).

As used herein, an "array" of articles (e.g., nanoscopic wires) comprises a plurality of the articles.

As used herein, "plurality" means two or more.

As used herein, the terms "comprising," "including," "carrying," "having," "containing," "involving," and the like are to be understood to be open-ended, i.e., to mean including but not limited to.

OVERVIEW OF THE INVENTION

As set forth above, conventional optical microscopy generally has an imaging resolution of half the wavelength of the illuminating light, referred to as the diffraction limit. To break this limit various instruments have been developed, such as atomic force microscope (AFM), near-field scanning optical microscope (NSOM), and scanning electron microscope (SEM). However, it is still a challenge and desirable to develop a near-field nanoscale-object imaging device that: (1) has much higher power throughput than that of current NSOM; and (2) is capable of imaging objects with faster speed.

The present invention, in one aspect, relates to a novel near-field nano-imaging device based on a nanoscale-pixel photodetector (NPD) array. $In_{0.53}Ga_{0.47}As$ ternary compound is chosen as active material due to its band gap energy of 0.8 eV and lattice matching to InP material, which has extensive applications in optical communications. Additionally, $In_{0.52}Al_{0.48}As$ is used as Schottky barrier enhancement layer to reduce the dark current of the NPD device. A simplified superlattice (SL) structure is used as transition layer between $In_{0.52}Al_{0.48}As$ contact layer and $In_{0.53}Ga_{0.47}As$ absorbing layer to smooth the band gap discontinuity at the $In_{0.52}Al_{0.48}As/In_{0.53}Ga_{0.47}As$ heterointerface and reduce carrier trapping. A vertical sandwiching structure instead of a conventional planar structure Metal-Semiconductor-Metal electrode configuration is used due to its simple fabrication, fast response, and ease in addressing the pixels. To explore the highest available resolution of NPD array, electromagnetic simulations are performed using finite difference time domain (FDTD) method. The highest resolution one may obtain for now using the embodiments of the present invention is around 150 nm for near-IR wavelength corresponding to $\lambda_F/10$. This is about 20 times smaller in terms of resolution area than that of the diffraction limited conventional optical imaging system. Various photolithography, e-beam lithography, wafer bonding and etching back techniques have been developed to realize the thin-film based photodetector structures. A slab version of the NPD device has been successfully fabricated.

Various unique features of the present invention will be made as to the embodiments of the present invention in conjunction with the accompanying drawings in FIGS. 1-11.

Referring to FIG. 1 first, the present invention, in one aspect, relates to an imaging device. In one embodiment, imaging device 100 includes a plurality of first electrode strips 102 in parallel to each other along a first direction x, wherein each first electrode strip 102 has an elongated body with a first surface 102a and an opposite, second surface 102b and a thickness $n_1$. The imaging device 100 also includes a plurality of second electrode strips 106 in parallel to each other along a second direction y that is substantially perpendicular to the first direction x, wherein each second electrode strip 106 has an elongated body with a first surface 106a and an opposite, second surface 106b and a thickness $n_2$. The plurality of second electrode strips 106 are positioned apart from the plurality of first electrode strips 102 along a third direction z that is substantially perpendicular to the first direction x and the second direction y such that the plurality of first electrode strips 102 and the plurality of second electrode strips 106 are crossing each other accordingly to form a corresponding number of crossing points. And at each crossing point, a semiconductor component 104 is filled between the second surface 102b of a corresponding first electrode strip 102 and the first surface 106a of a corresponding second electrode strip 106 to form an addressable pixel 101a, 101b, 101c or 101d, wherein the semiconductor component 104 has a thickness $n_s$ that satisfies the following relationship: $n_s \geq n_1$, $n_2$. The total number of the plurality of first electrode strips 102 can be a nonzero integer M, and the total number of the plurality of second electrode strips 106 can be a nonzero integer N, which can form an array with N×M pixels. N, M can be same or different, even or odd.

For the configuration shown in FIG. 1, N=M=2. As such configured as shown in FIG. 1, there is a gap between pixel 101a and pixel 101d along the x direction, there is a gap between pixel 101b and pixel 101c along the x direction, there is a gap between pixel 101a and pixel 101b along the y direction, and there is a gap between pixel 101c and pixel 101d along the y direction. Accordingly, for the configuration shown in FIG. 1 that has two first electrode strips 102, and two second electrode strips 106, a first channel is formed along the y direction between the two neighboring second electrode strips 106, and a second channel is formed along the x direction between the two neighboring first electrode strips 102, where the first channel and the second channel are in communication to each other. Thus, pixels 101a, 101b, 101c and 101d form an 2×2 array, which has a type of channelized structure as shown in FIG. 1.

In operation, when an illuminating light containing information of an object is incident onto the first surface 102a of a first electrode strip 102 of, say, an addressable pixel 101a, a corresponding imaging signal is generated at the second surface 106b of the corresponding second electrode strip 106.

In one embodiment, still referring to FIG. 1, the semiconductor component 104 is a layered structure containing at least at least one layer of a first semiconductor and at least one layer of a second semiconductor. In one embodiment, the layered structure is a graded super lattice having a layer 144 of InGaAs, as the at least one layer of a first semiconductor, between two layers 134a, 134b of InAlAs, as at least one layer of a second semiconductor. Moreover, a grading layer 124a, 124b of InAlAs/InGaAs is filled between each of the two layers 134a, 134b of InAlAs and a corresponding surface of the layer 144 of InGaAs, and the graded super lattice has a thickness <1,000 nm. Other suitable semiconductor materials can also be used to practice the present invention.

Each first electrode strip 102 is a transparent conducting oxide electrode. In one embodiment, the transparent conducting oxide electrode comprises Au/Ti, and has a thickness of about 60 nm. Other suitable metal/conductive materials can also be used to form first electrode strips.

Each second electrode strip 106 is a transparent conducting oxide electrode or a metal electrode, which also has a thickness of about 60 nm.

The imaging device 100 further has a plurality of detector circuits (not shown), where each detector circuit is connectable to a first electrode strip 102 and a second electrode strip 106 of a corresponding pixel 101a, 101b, 101c, or 101d, for detecting imaging signals generated at that pixel.

Figure 3:
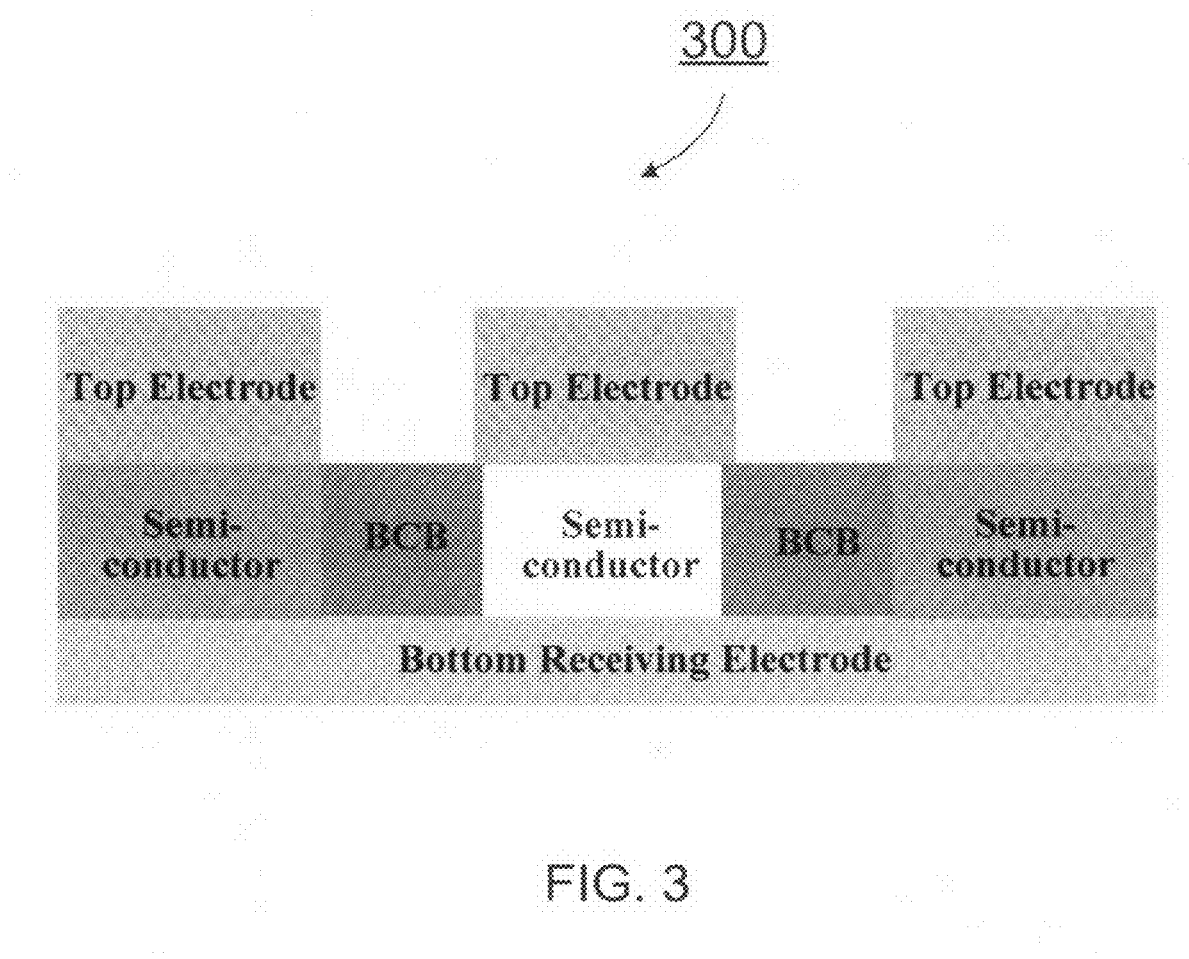
FIG. 3 is a sectional view of a nanoscale-pixel photodetector (NPD) array in part according to yet another embodiment of the present invention.
Figure 5:
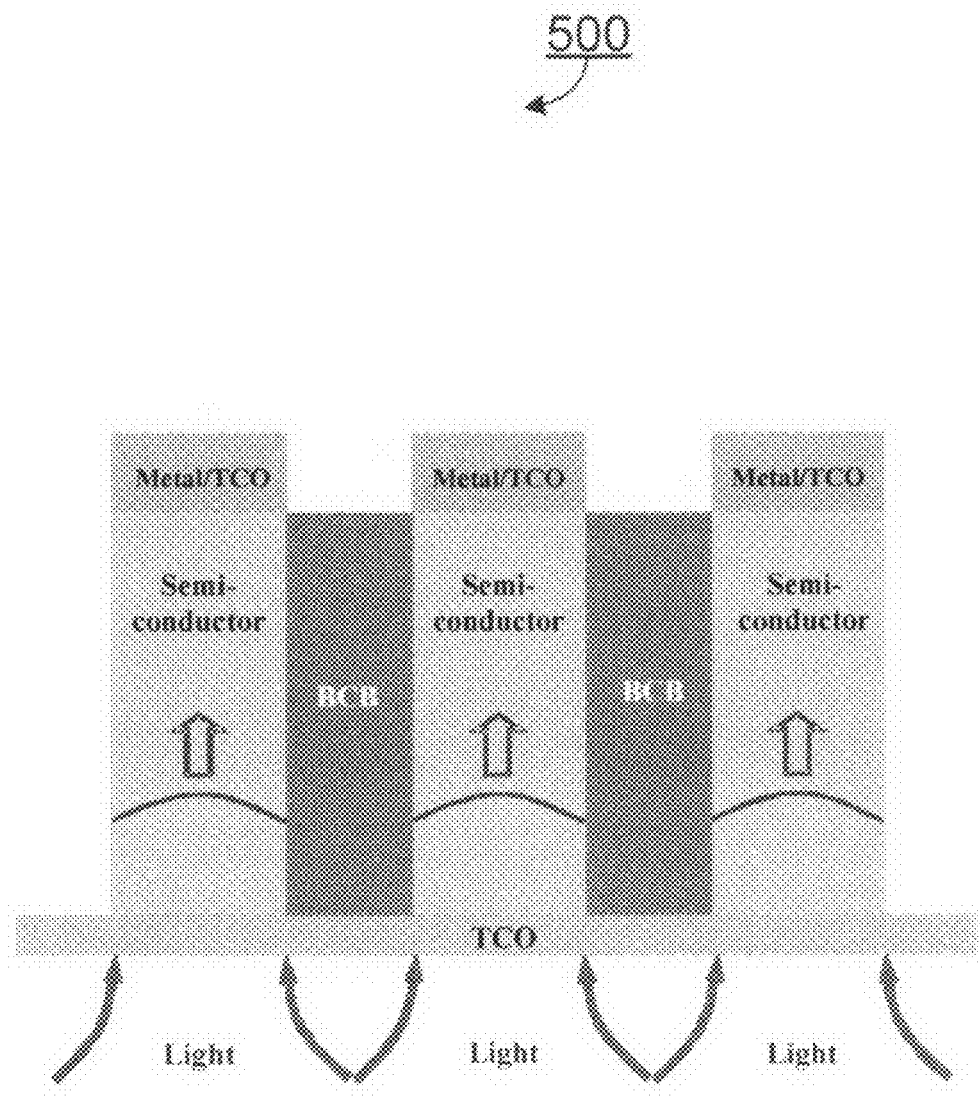
FIG. 5 is a sectional view of a nanoscale-pixel photodetector (NPD) array in part according to another embodiment of the present invention.
Figure 6:
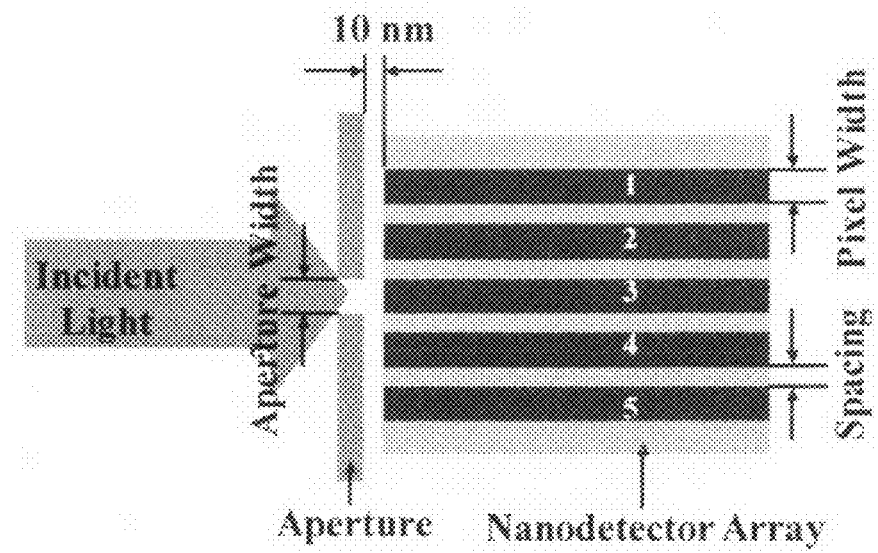
FIG. 6: (a) FDTD simulation scheme to optimize NPD design according to one embodiment of the present invention; and (b) Simulation results of the optimal NPD structure. The smallest resolution obtained for 1.55 μm wavelength light is 150 nm.
Figure 6:
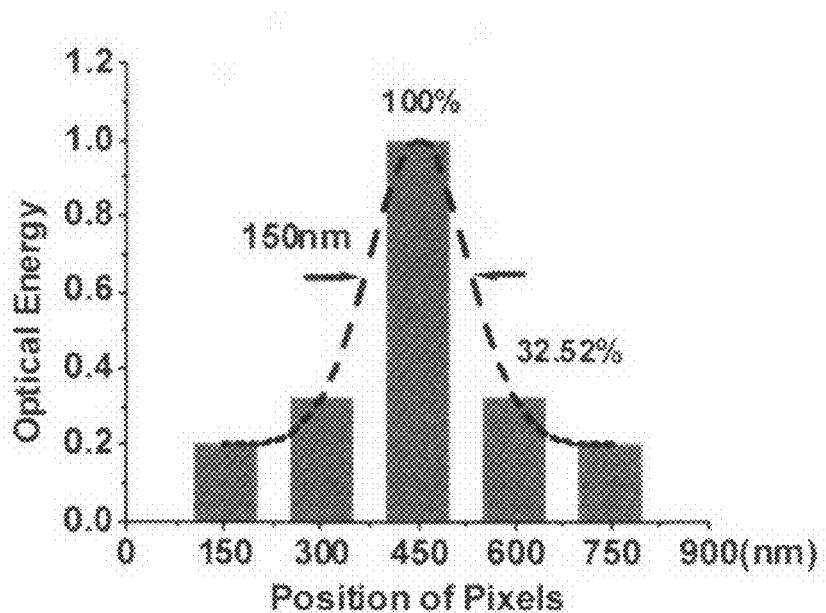
Figure 7:
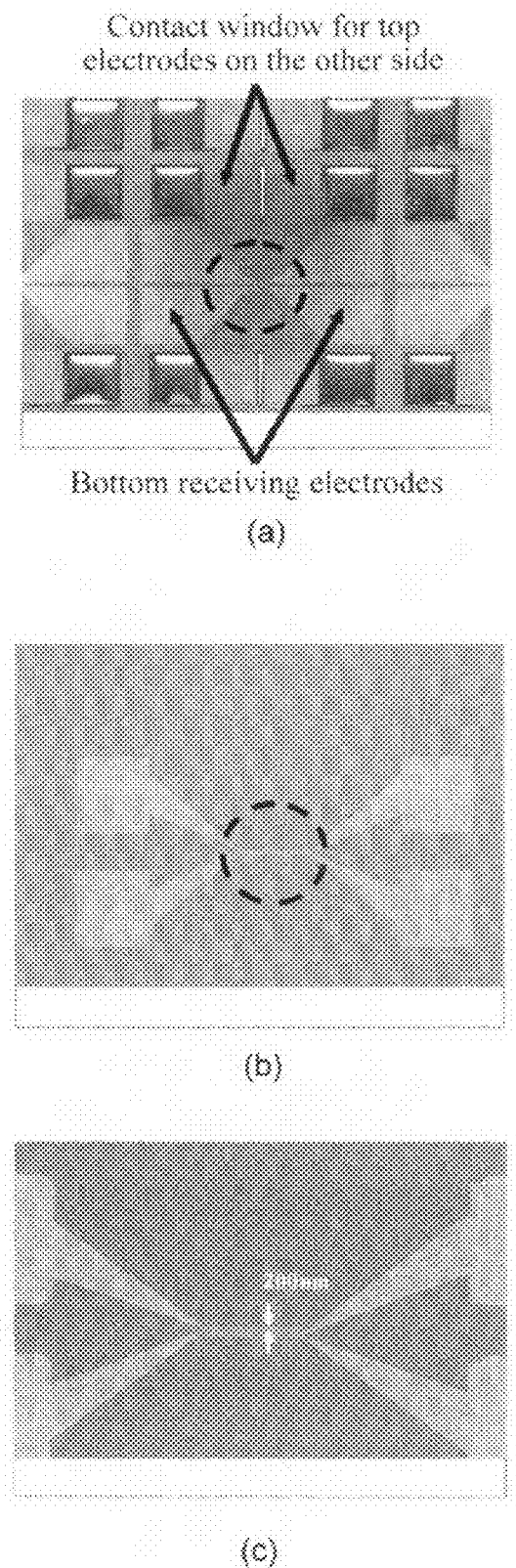
FIG. 7: (a) Top view of a 4×4 NPD array device according to one embodiment of the present invention. Circled region is shown in smaller scale in the next figure; (b) zoomed in structure of circled region in figure (a); and (c) an SEM picture of circled region in (b), and the pixel width is about 200 nm.
Figure 8:
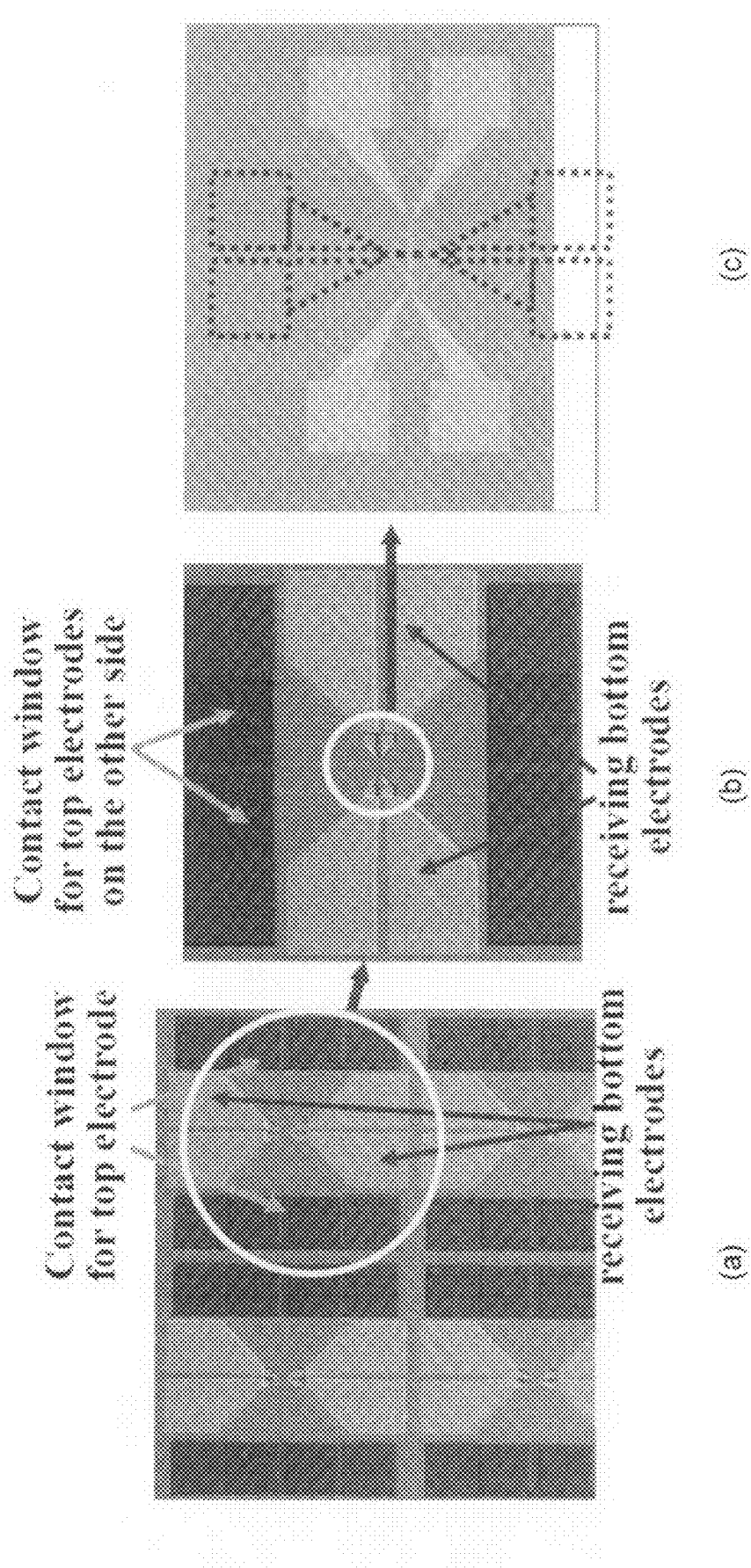
FIG. 8: (a) Top view of a 4×4, InGaAs NPD array device according to one embodiment of the present invention. Circled region is shown in smaller scale in the next figure; (b) zoomed in structure of circled region in figure (a); and (c) an SEM picture of circled region in (b).
Figure 9:
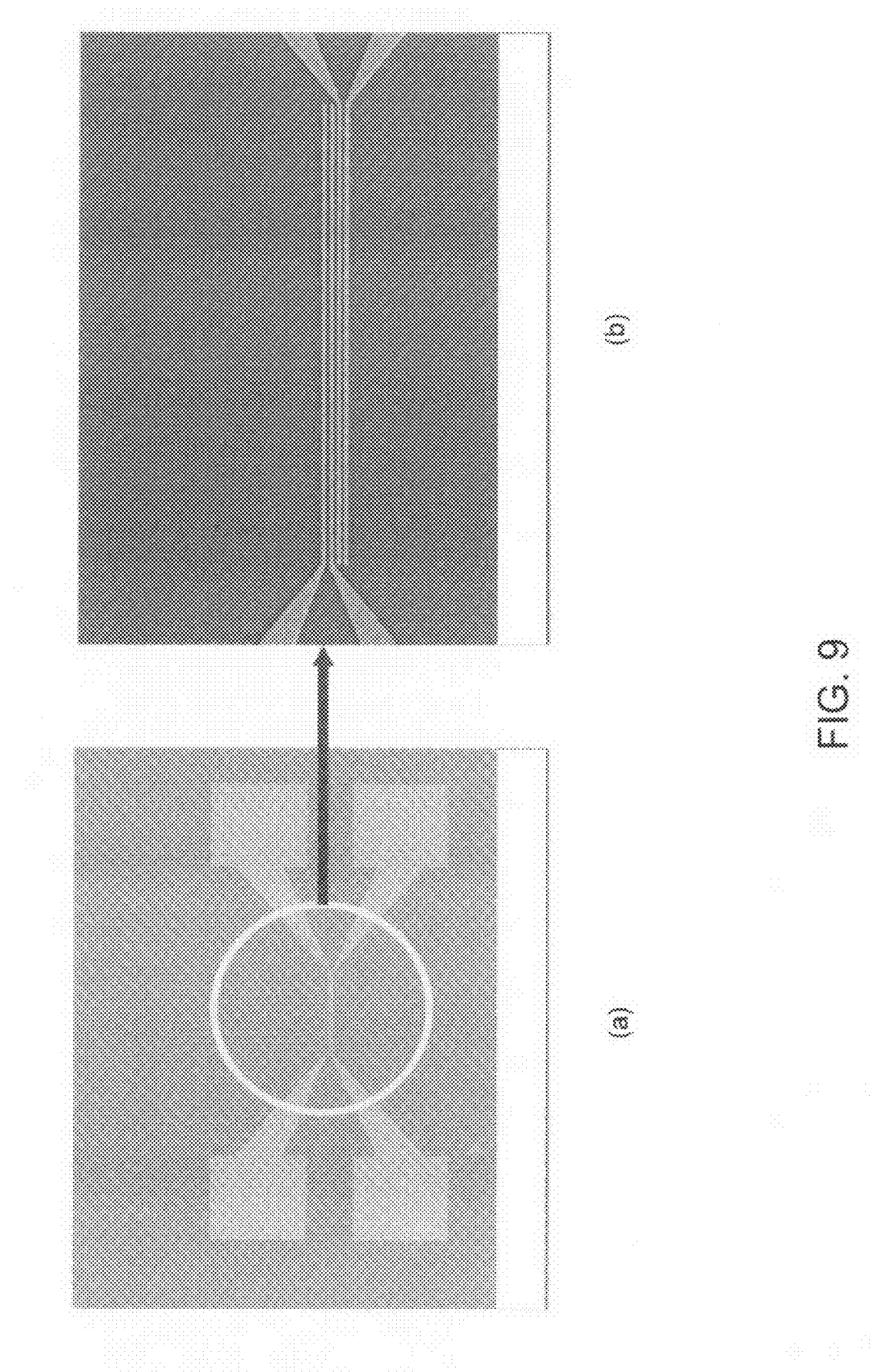
FIG. 9: (a) an SEM picture of a 4×4, InGaAs NPD array device of FIG. 8 in part according to one embodiment of the present invention. Circled region is shown in smaller scale in the next figure; and (b) zoomed in structure of circled region in (a), and the pixel width is about 150 nm.
Figure 10:
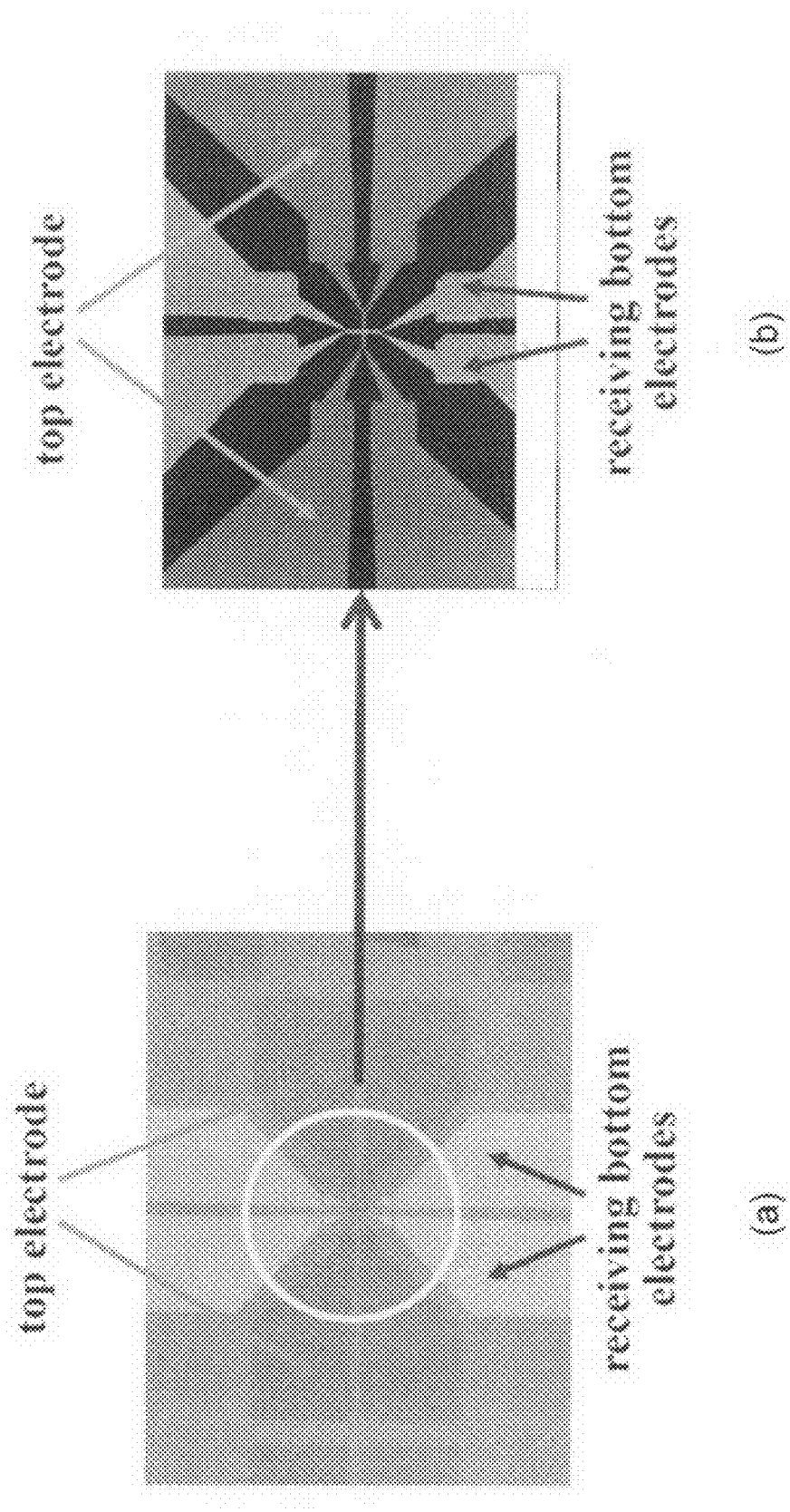
FIG. 10: (a) an SEM picture of a 4×4, InGaAs NPD array device in part according to one embodiment of the present invention. Circled region is shown in smaller scale in the next figure; and (b) zoomed in structure of circled region in (a).

Furthermore, for an imaging device 300 and 500 according to embodiments of the present invention as shown in FIG. 3 and FIG. 5, respectively, a protective material such as benzocyclobutene (BCB) is filled between pixels to support device structures and form cladding layer to each pixel.

Figure 2:
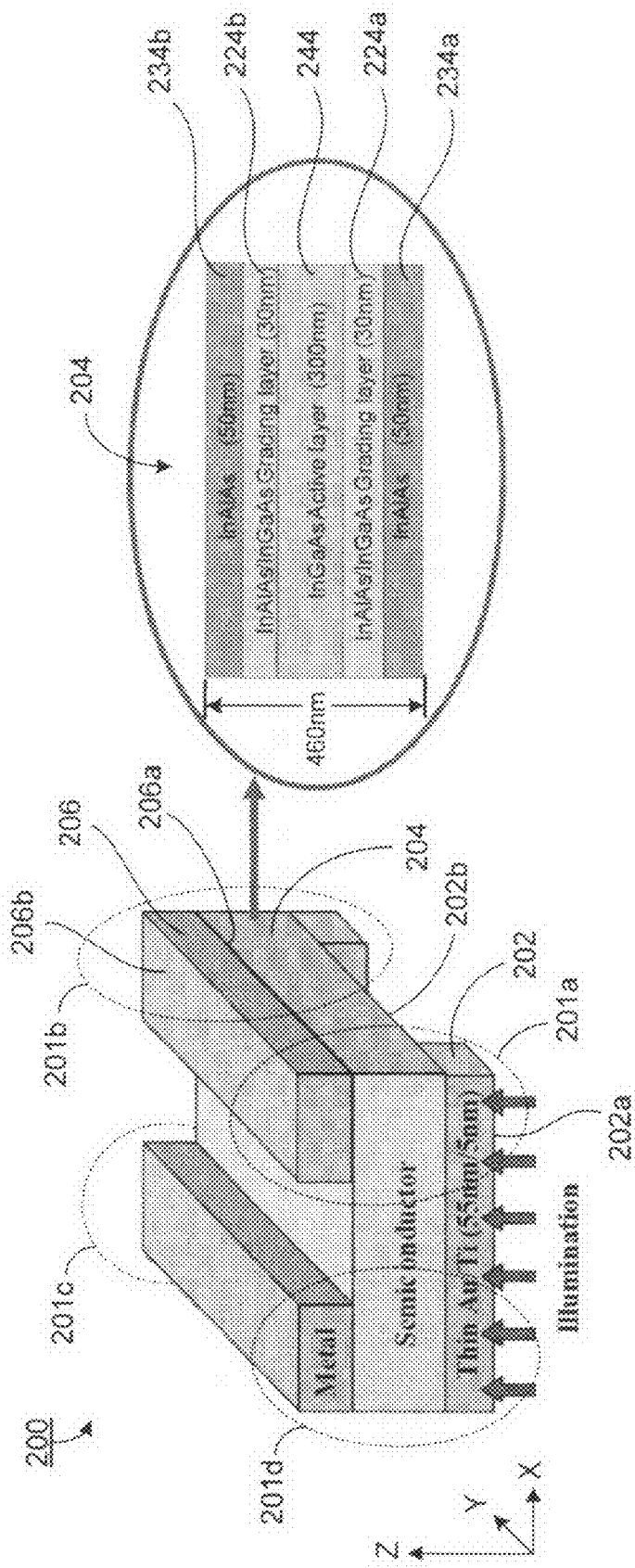
FIG. 2 is a schematic, perspective view of a nanoscale-pixel photodetector (NPD) array in part according to another embodiment of the present invention.

Referring now to FIG. 2, an imaging device 200 according to another embodiment of the present invention is shown. Imaging device 200 includes a plurality of first electrode strips 202 in parallel to each other along a first direction x, wherein each first electrode strip 202 has an elongated body with a first surface 202a and an opposite, second surface 202b and a thickness $n_1$. The imaging device also includes a plurality of second electrode strips 206 in parallel to each other along a second direction y that is substantially perpendicular to the first direction x, wherein each second electrode strip 206 has an elongated body with a first surface 206a and an opposite, second surface 206b and a thickness $n_2$. The plurality of second electrode strips 206 are positioned apart from the plurality of first electrode strips 202 along a third direction z that is substantially perpendicular to the first direction x and the second direction y such that the plurality of first electrode strips 202 and the plurality of second electrode strips 206 are crossing each other accordingly to form a corresponding number of crossing points. A semiconductor component 204 is filled between the plurality of first electrode strips 202 and the plurality of second electrode strips 206 to form an addressable pixel 201a, 201b, 201c or 201d, at each crossing point, respectively, wherein the semiconductor component 104 has a thickness $n_s$ that satisfies the following relationship: $n_s \geq n_1$, $n_2$. The total number of the plurality of first electrode strips 202 can be a nonzero integer M, and the total number of the plurality of second electrode strips 206 can be a nonzero integer N, which can form an array with N×M pixels. N, M can be same or different, even or odd.

For the configuration shown in FIG. 2, N=M=2. As such configured as shown in FIG. 2, there is a gap between pixel 201a and pixel 201d along the x direction, there is a gap between pixel 201b and pixel 201c along the x direction, there is a gap between pixel 201a and pixel 201b along the y direction, and there is a gap between pixel 201c and pixel 201d along the y direction. Accordingly, for the configuration shown in FIG. 2 that has two first electrode strips 202, and two second electrode strips 206, a first channel is formed along the y direction between the two neighboring second electrode strips 206, and a second channel is formed along the x direction between the two neighboring first electrode strips 202. However, because the semiconductor component 204 takes the form of a slab, the first channel and the second channel are not in communication to each other. Still, pixels 201a, 201b, 201c and 201d form an 2×2 array, which has a type of slab structure as shown in FIG. 2.

In operation, when an illuminating light containing information of an object is incident onto the first surface 202a of a first electrode strip 202 of, say, an addressable pixel 201, a corresponding imaging signal is generated at the second surface 206b of the corresponding second electrode strip 206.

The semiconductor component 204 is a layered structure containing at least at least one layer of a first semiconductor and at least one layer of a second semiconductor. In one embodiment, the layered structure is a graded super lattice having a layer 244 of InGaAs, as the at least one layer of a first semiconductor, between two layers 234a, 234b of InAlAs, as at least one layer of a second semiconductor. Moreover, a grading layer 224a, 224b of InAlAs/InGaAs is filled between each of the two layers 234a, 234b of InAlAs and a corresponding surface of the layer 244 of InGaAs, and the graded super lattice has a thickness <1,000 nm. Other suitable semiconductor materials can also be used to practice the present invention.

Each first electrode strip 202 is a transparent conducting oxide electrode. In one embodiment, the transparent conducting oxide electrode comprises Au/Ti, and has a thickness of about 60 nm. Other suitable metal/conductive materials can also be used to form first electrode strips.

Each second electrode strip 206 is a transparent conducting oxide electrode or a metal electrode, which also has a thickness of about 60 nm.

The imaging device 200 further has a plurality of detector circuits (not shown), where each detector circuit is connectable to a first electrode strip 202 and a second electrode strip 206 of a corresponding pixel 201a, 201b, 201c, or 201d, for detecting imaging signals generated at that pixel.

Figure 4:
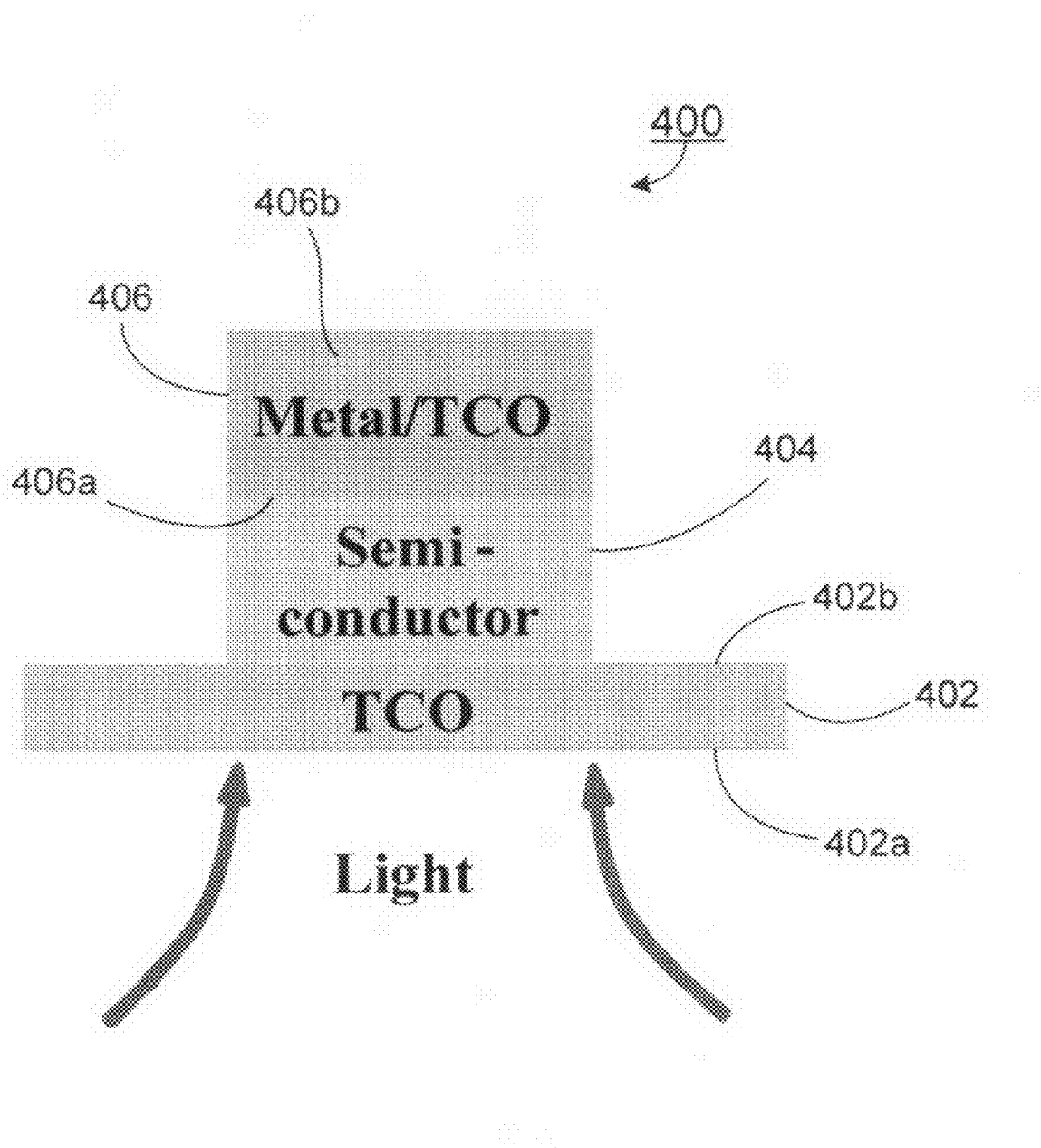
FIG. 4 is a sectional view of a pixel of a nanoscale-pixel photodetector (NPD) array in part according to one embodiment of the present invention.

Now referring to FIG. 4, the present invention, in yet another aspect, relates to an imaging device that has one or more pixels 400. In one embodiment, imaging pixel 400 has a first electrode strip 402 having a first surface 402a and an opposite, second surface 402b and a thickness $n_1$. The imaging pixel 400 also has a second electrode strip 406 having a first surface 406a and an opposite, second surface 406b and a thickness $n_2$. The second electrode strip 406 is positioned apart from the first electrode strip 402. Moreover, the imaging pixel 400 has a semiconductor component 404 that is filled between the first electrode strip 402 and the plurality of second electrode strip 406, wherein the semiconductor component 404 has a thickness $n_s$ that satisfies the following relationship: $n_s \geq n_1, n_2$. In operation, when an illuminating light containing information of an object is incident onto the first surface 402a of the first electrode strip 402, a corresponding imaging signal is generated at the second surface 406b of the second electrode strip 406.

The semiconductor component 404 has a layered structure (not shown) containing at least at least one layer of a first semiconductor and at least one layer of a second semiconductor, wherein the layered structure is a graded super lattice comprising a layer of InGaAs, as the at least one layer of a first semiconductor, between two layers of InAlAs, as at least one layer of a second semiconductor. In one embodiment, a grading layer of InAlAs/InGaAs is filled between each of the two layers of InAlAs and a corresponding surface of the layer of InGaAs, and wherein the graded super lattice has a thickness <1,000 nm.

The first electrode strip 402 is a transparent conducting oxide electrode. The second electrode strip 406 is a transparent conducting oxide electrode or a metal electrode.

A detector circuit (not shown) can be connectable to the first electrode strip 402 and the second electrode strip 406 for detecting imaging signals generated at that pixel.

These and other aspects of the present invention are further described below.

EXAMPLES AND IMPLEMENTATIONS OF THE INVENTION

Without intent to limit the scope of the invention, exemplary methods and their related results according to the embodiments of the present invention are given below. Note again that titles or subtitles may be used in the examples for convenience of a reader, which in no way should limit the scope of the invention. Moreover, certain theories are proposed and disclosed herein; however, in no way they, whether they are right or wrong, should limit the scope of the invention.

Example 1

This example illustrates the design of an nanoscale-pixel photodetector (NPD) array.

The present invention, in another aspect, relates to an imaging device that utilizes an NPD array. In one embodiment, such an NPD array is designed to be used for obtaining the nano-imaging with sub-wavelength resolution. Generally GaAs material is used for 0.8 μm wavelength detection and has demonstrated a good performance [3-4]. For near-IR (1.0-1.6 μm) wavelength range, typically $In_{0.53}Ga_{0.47}As$, AlGaAs, InGaP and $In_{0.52}Al_{0.48}As$ are chosen as active material. In an initial realization of NPD array, a layer of $In_{0.53}Ga_{0.47}As$ ternary compound, such as layer 144 as shown in FIG. 1, is chosen as active material due to its band gap energy of 0.8 eV and lattice matching to InP material that has extensive applications in optical communications. A lattice-matched $In_{0.52}Al_{0.48}As$ Schottky barrier enhancement layer, such as layer 134a or layer 134b as shown in FIG. 1, is inserted between a metal layer, such as layer 102 or layer 106 as shown in FIG. 1, and the $In_{0.53}Ga_{0.47}As$ active layer to elevate the electrode Schottky barrier height. In addition, a simplified superlattice (SL) structure is used for transition layer between $In_{0.52}Al_{0.48}As$ contact layer and $In_{0.53}Ga_{0.47}As$ absorbing layer due to the limit of film deposition using Metal Organic Chemical Vapor Deposition (MOCVD). The graded super lattice 104 has 3 periods of $In_{0.52}Al_{0.48}As$ and $In_{0.53}Ga_{0.47}As$, where the first period is composed of 7 nm of $In_{0.53}Ga_{0.47}As$ and 3 nm of $In_{0.52}Al_{0.48}As$, and the last period is reversed with 3 nm of $In_{0.53}Ga_{0.47}As$ and 7 nm of $In_{0.52}Al_{0.48}As$. The intermediary layer varies linearly between two endpoints in 2 nm increments. One purpose of the SL transition region is to smooth the band gap discontinuity at the $In_{0.52}Al_{0.48}As/In_{0.53}Ga_{0.47}As$ heterointerface and reduce carrier trapping. Otherwise, the carrier trapping will lead to nonradiative recombination centers originating from strained/relaxed layers caused by previous fabrication works, resulting in degraded photodetector's performance [5].

A Metal-Semiconductor-Metal structure is used for the NPD array due to its high-speed response and relatively simple realization. Generally, a conventional MSM structure has planar electrode geometry, which is difficult to realize pixel-addressing function. To overcome the deficiency, for the designs as shown in FIG. 1 and FIG. 2, for examples, a vertical sandwiching structure with electrodes above (106, 206) and below (102, 202) the thin intrinsic semiconductor layer (104, 204) is used to realize pixel addressing. To detect a certain pixel, say pixel 101a, one just needs to connect to the right top and bottom electrode stripes 102, 106 accordingly, where the top and bottom electrode stripes crosses will be the one pixel (or photo-detector) that is sensed by a corresponding detector circuit. Thus, for utilizing an NPD array with M×N stripes, one can address M×N pixels, where M, N are integers. For the designs as shown in FIG. 1 and FIG. 2, M=2, and N=2, thus there are 2×2=4 pixels in each of the arrays that can be addressed.

Figure 11:
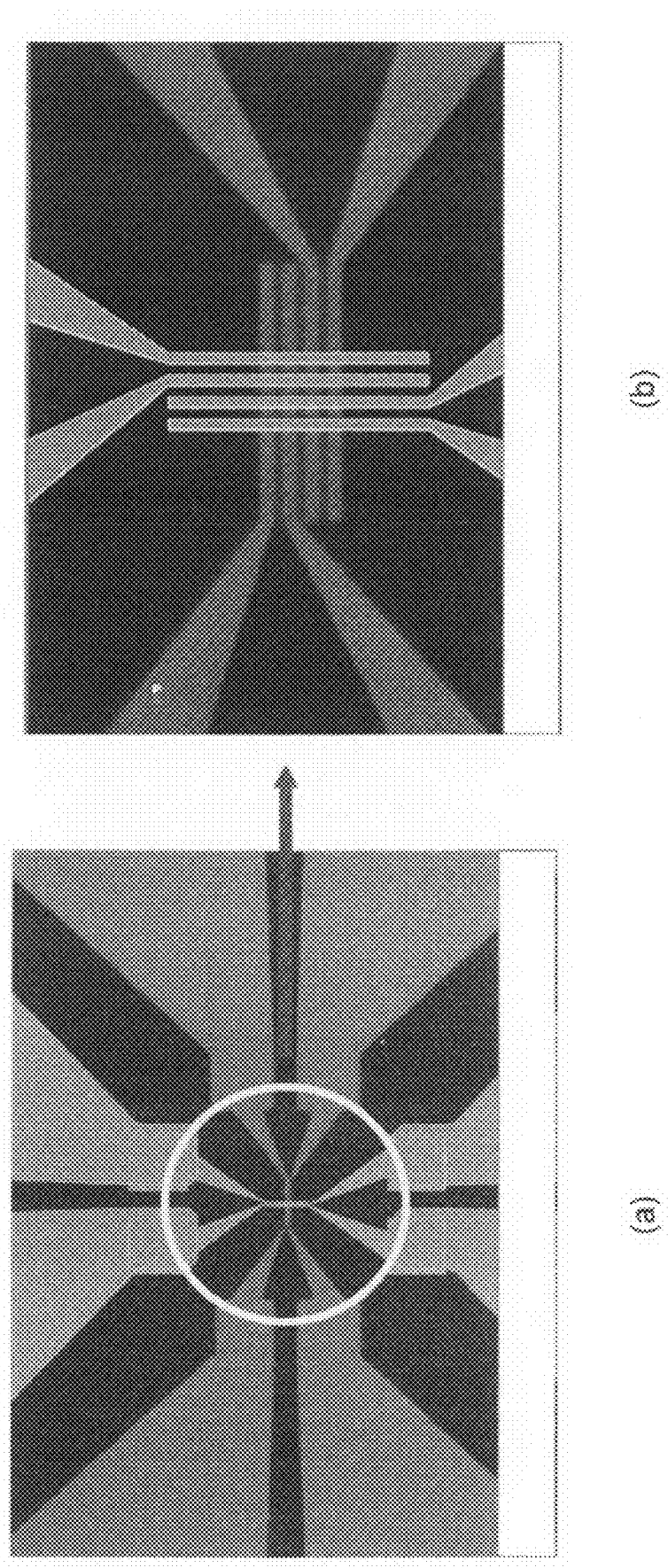
FIG. 11: (a) an SEM picture of a 4×4, InGaAs NPD array device in part according to one embodiment of the present invention. Circled region is shown in smaller scale in the next figure; and (b) zoomed in structure of circled region in (a), showing a channelized structure.

In order to achieve high pixel resolution at sub-wavelength region, the detector thickness has to be very thin, which will inevitably reduce the detection efficiency of the active region. To overcome this problem, an NPD array with a channelized structure is shown in FIG. 1. By carefully selecting the detection material, filling material between NPD pixels and pixel dimensions of such channelized NPD devices, a structure as small as a few hundreds of nanometers diameter (see FIG. 1) can form an effective channel waveguide that has a single-mode waveguide size of λ(2*n), where n is the refractive index. For example, a structure, which has the refractive indices of about 3.4 and 1.5 for the core and cladding, respectively, will form an effective channel waveguide that has a single-mode waveguide size of λ/(2*n)=235 nm for 1.55 μm light. Thus, using the NPD array with a channelized structure as shown in FIG. 1, where each pixel (101a, 101b, 101c or 101d) is channelized as a nano-waveguiding rod, the detector active layer could be thicker and still be able to achieve high spatial resolution. The improved detection efficiency and resolution have been obtained by the simulation, which is described in details below. FIG. 2 shows the 3D Schematic for a slab NPD array according to another embodiment of the present invention and FIG. 11 shows a top view of a 4×4 NPD array.

Example 2

This example describes simulations conducted with respect to a theoretic model for the design of a nanoscale-pixel photodetector (NPD) array according to one embodiment of the present invention.

The simulation have been conducted using Finite-Difference Time-Domain (FDTD) method to explore the obtainable smallest resolution by an NPD array according to one or more embodiments of the present invention, optimize NPD pixel width and pixel spacing for different resolution and understand the physics behind nano-imaging by NPD array. The simulation scheme is shown in FIG. 6(a), where a small slit is used to simulate the probing light with 1.55 μm wavelength shining on tiny structures. Since all practical NPD devices will work in the near-field region of illuminating light, the distance between aperture and the NPD array is set to be 10 nm, which assures that central pixels are within the near-field region of the light from aperture. The slit width keeps the same as that of the pixel right after it. The NPD array, which has pixels 1, 2, 3, 4, and 5, and is positioned behind the slit opening, varies its structure, such as pixel width and spacing between pixels to optimize the performance of NPD. The refractive index of pixel material, InGaAs, is chosen to be 3.46. Since BCB material fills all the regions between NPD pixels, a refractive index of 1.5 is used between pixels. Optical energy in each pixel is measured and compared. In doing so, a resolution criteria of 1/e is used, i.e. when optical energy in one pixel is less than 1/e of that in the pixel next to it, these two pixels are distinguishable. For example, if the optical energy in pixel 3 is 100 W and 20 W in pixel 2, respectively, one will have the ratio of 20 W/100 W=20% that is less than 1/e, which indicates that these two pixels 2 and 3 are distinguishable. The study of influence of pixel width and pixel spacing on available resolution is also conducted.

From simulations, it turns out the optical coupling between pixels is a primary factor to affect the performance of an NPD array. The smallest spacing between distinguishable pixels for 1.55 μm wavelength is 100 nm, which is comparable to previous results [6], when using 1/e as resolution criteria, seen in FIG. 6(b). If one defines the resolution as the sum of pixel width and spacing between them, the highest resolution by an NPD array one may obtain is around 150 nm. It corresponds to about $\lambda_F/10$ for near-IR wavelength. It is about 25 times higher than the diffraction limited conventional imaging system in terms of imaging area.

Example 3

This example describes making and characterization with respect to a nanoscale-pixel photodetector (NPD) array according to one embodiment of the present invention.

For the NPD array with sub-wavelength resolution, various photolithography, e-beam lithography [7,8], wafer bonding and etching back techniques have been developed to realize the thin-film based photodetector structures.

To optimize the fabrication procedures of an NPD array, several slab version nanometer scale photodetector arrays were fabricated. In the fabrication, pixels spacing and pixel width varied from 50 nm to 500 nm to study the influence of the dimension of detection array pixel on NPD devices' performance. A very thin metal layer of Au/Ti (55 nm/5 nm) was deposited as receiving bottom electrodes. The thickness of metal is chosen as thin as 60 nm, and the illuminating near-IR light is expected to penetrate the electrode and reach the absorbing semiconductor region.

NPD arrays with up to 4×4 pixels have been successfully fabricated. As an example, the top view of a 4×4 nanophoto-detector array is shown in FIG. 7(a), where the circled region is shown in a smaller scale in FIG. 7(b). Likewise, FIG. 7(c) shows the central detection region of the 4×4 NPD array, where pixel width is as small as 200 nm. In addition, initial measurements of sample photodetector devices show a dark current density of about 20 pA/μm$^2$ at 10V and a responsivity of about 0.4 A/W for 1.31 μm light. FIG. 8, FIG. 9, FIG. 10 and FIG. 11 each shows partial views of NPD arrays made according to various embodiments of the present invention.

Thus, in sum, among other things, the present invention in one aspect provides a novel design and realization of near-field nano-imaging device based on NPD array. Simulation shows that the optical coupling between pixels is a primary factor to affect the performance of the NPD-based imaging device and the smallest resolution for the light with 1.5 μm wavelength is 150 nm for the embodiments shown.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. For example, multiple probes may be utilized at the same time to practice the present invention. Accordingly, the scope of the present invention is defined by the appended claims rather than the foregoing description and the exemplary embodiments described therein.

LIST OF REFERENCES

1 D. W. Pohl. "Scanning Near-field Optical Microscopy (SNOM)," Advances in Optical and Electron Microscopy, vol. 12, pp. 243-312, 1991.
2 T. Yatsui, K. Itsumi, M. Kourogi, and M. Ohtsu, "Metallized Pyramidal Silicon Probe with Extremely High Throughput and Resolution Capability for Optical Near-field Technology," Appl. Phys. Lett., vol. 80, pp. 2257-2259, 2002.

3 C. Youtseya) and I. Adesida, et al. J. B. D. Soole, M. R. Amersfoort, H. P. LeBlanc, N. C. Andreadakis, A. Rajhel, C. Caneau, M. A. Koza, and R. Bhat, J. Vac. Sci. Technol. B 14(6), 1996.

4 Sean L. Rommel, a) Jae-Hyung Jang, Wu Lu, Gabriel Cueva, Ling Zhou, and Ilesanmi Adesida. et al., J. Vac. Sci. Technol. B 20.4., 2002.

5 D. H. Lee, Sheng S. Li, N. J. Sauer, T. Y. Chang, "High Quality In0.53Ga0.47As Schottky Diode Formed by Graded Superlattice of In0.53Ga0.47As/In0.52Al0.48As," Appl. Phys. Lett. vol. 54, pp. 1863-1865, 1989.

6 Ki Young Kim, Boyang Liu, et al., "Simulation of Photodetection Using Finite-Difference Time-Domain method with Application to Near-field Subwavelength Imaging Based on Nanoscale Semiconductor Photodetector Array", Optical and Quantum Electronics, in press, 2008.

7 Boyang Liu, Seng-Tiong Ho, "Sub-100 nm Nanolithography and Pattern Transfer on Compound Semiconductor using Sol-gel Derived TiO2 Resist", Journal of The Electrochemical Society, Vol. 155, No. 5, 2008.

8 Boyang Liu, Yingyan Huang, et al, "Sub-10 nm Nanolithography and Pattern Transfer on Semiconductor compounds Using Spin-Coatable ZrO2 Resist by Inductively Coupled Plasma Reactive Ion Etching (ICP-RIE)", Nanotechnology, 19 155303, 2008.

What is claimed is:

1. An imaging device, comprising:
   (a) a plurality of first electrode strips in parallel to each other along a first direction, wherein each first electrode strip has an elongated body with a first surface and an opposite, second surface and a thickness $n_1$;
   (b) a plurality of second electrode strips in parallel to each other along a second direction that is substantially perpendicular to the first direction, wherein each second electrode strip has an elongated body with a first surface and an opposite, second surface and a thickness $n_2$, and wherein the plurality of second electrode strips are positioned apart from the plurality of first electrode strips along a third direction that is substantially perpendicular to the first direction and the second direction such that the plurality of first electrode strips and the plurality of second electrode strips are crossing each other accordingly to form a corresponding number of crossing points; and
   (c) at each crossing point, a semiconductor component is filled between the second surface of a corresponding first electrode strip and the first surface of a corresponding second electrode strip to form an addressable pixel,
   wherein the semiconductor component has a thickness $n_s$ that satisfies the following relationship: $n_s \geq n_1, n_2$, and wherein, in operation, when an illuminating light containing information of an object is incident onto the first surface of a first electrode strip of an addressable pixel, a corresponding imaging signal is generated at the second surface of the corresponding second electrode strip.

2. The imaging device of claim 1, wherein the semiconductor component comprises a layered structure containing at least at least one layer of a first semiconductor and at least one layer of a second semiconductor.

3. The imaging device of claim 2, wherein the layered structure is a graded super lattice comprising a layer of InGaAs, as the at least one layer of a first semiconductor, between two layers of InAlAs, as at least one layer of a second semiconductor.

4. The imaging device of claim 3, wherein a grading layer of InAlAs/InGaAs is filled between each of the two layers of InAlAs and a corresponding surface of the layer of InGaAs, and wherein the graded super lattice has a thickness <1,000 nm.

5. The imaging device of claim 1, wherein each first electrode strip is a transparent conducting oxide electrode.

6. The imaging device of claim 5, wherein the transparent conducting oxide electrode comprises Au/Ti, and has a thickness of about 60 nm.

7. The imaging device of claim 6, wherein each second electrode strip is a transparent conducting oxide electrode or a metal electrode.

8. The imaging device of claim 1, further comprising a plurality of detector circuits, wherein each detector circuit is connectable to a first electrode strip and a second electrode strip of a corresponding pixel for detecting imaging signals generated at that pixel.

9. The imaging device of claim 1, wherein benzocyclobutene (BCB) is filled between pixels to support device structures and form cladding layer to each pixel.

10. An imaging device, comprising:
    (a) a plurality of first electrode strips in parallel to each other along a first direction, wherein each first electrode strip has an elongated body with a first surface and an opposite, second surface and a thickness $n_1$;
    (b) a plurality of second electrode strips in parallel to each other along a second direction that is substantially perpendicular to the first direction, wherein each second electrode strip has an elongated body with a first surface and an opposite, second surface and a thickness $n_2$, and wherein the plurality of second electrode strips are positioned apart from the plurality of first electrode strips along a third direction that is substantially perpendicular to the first direction and the second direction such that the plurality of first electrode strips and the plurality of second electrode strips are crossing each other accordingly to form a corresponding number of crossing points; and
    (c) a semiconductor component is filled between the plurality of first electrode strips and the plurality of second electrode strips to form an addressable pixel at each crossing point,
    wherein the semiconductor component has a thickness $n_s$ that satisfies the following relationship: $n_s \geq n_1, n_2$, and wherein, in operation, when an illuminating light containing information of an object is incident onto the first surface of a first electrode strip of an addressable pixel, a corresponding imaging signal is generated at the second surface of the corresponding second electrode strip.

11. The imaging device of claim 10, wherein the semiconductor component comprises a layered structure containing at least at least one layer of a first semiconductor and at least one layer of a second semiconductor.

12. The imaging device of claim 11, wherein the layered structure is a graded super lattice comprising a layer of InGaAs, as the at least one layer of a first semiconductor, between two layers of InAlAs, as at least one layer of a second semiconductor.

13. The imaging device of claim 12, wherein a grading layer of InAlAs/InGaAs is filled between each of the two layers of InAlAs and a corresponding surface of the layer of InGaAs, and wherein the graded super lattice has a thickness <1,000 nm.

14. The imaging device of claim 10, wherein each first electrode strip is a transparent conducting oxide electrode.

15. The imaging device of claim 14, wherein the transparent conducting oxide electrode comprises Au/Ti, and has a thickness of about 60 nm.

16. The imaging device of claim 15, wherein each second electrode strip is a transparent conducting oxide electrode or a metal electrode.

17. The imaging device of claim 10, further comprising a plurality of detector circuits, wherein each detector circuit is connectable to a first electrode strip and a second electrode strip of a corresponding pixel for detecting imaging signals generated at that pixel.

18. The imaging device of claim 10, wherein benzocyclobutene (BCB) is filled between pixels to support device structures and form cladding layer to each pixel.

* * * * *